(12) United States Patent
Wu et al.

(10) Patent No.: US 8,228,685 B2
(45) Date of Patent: Jul. 24, 2012

(54) HANDHELD ELECTRONIC DEVICE AND BUTTON INPUT DEVICE FOR USE WITH HANDHELD ELECTRONIC DEVICE

(75) Inventors: Chun-Che Wu, Taipei (TW); Chun-Nan Su, Taipei (TW)

(73) Assignee: Primax Electronics Ltd., Taipei (TW)

( * ) Notice: Subject to any disclaimer, the term of this patent is extended or adjusted under 35 U.S.C. 154(b) by 330 days.

(21) Appl. No.: 12/777,962

(22) Filed: May 11, 2010

(65) Prior Publication Data

US 2011/0188222 A1 Aug. 4, 2011

(30) Foreign Application Priority Data

Jan. 29, 2010 (TW) ................................ 99102538 A

(51) Int. Cl.
- H05K 7/02 (2006.01)
- H05K 7/04 (2006.01)
- H04M 1/00 (2006.01)
- A63F 9/24 (2006.01)
- A63F 13/00 (2006.01)
- G06F 17/00 (2006.01)
- G06F 19/00 (2006.01)
- A63F 13/02 (2006.01)

(52) U.S. Cl. .................. 361/807; 455/575.1; 455/575.4; 463/37; 273/148 B

(58) Field of Classification Search .................. 361/755, 361/801, 807; 16/327; 455/90.3, 575.1, 455/575.2, 575.4, 575.7; 345/169, 184; 463/36, 463/37, 38, 46; 273/148 B; 200/43.01, 43.19, 200/43.21, 43.22

See application file for complete search history.

(56) References Cited

U.S. PATENT DOCUMENTS 7,292,882 B2 * 11/2007 Lee et al. .................. 455/575.4
2010/0182763 A1 * 7/2010 Takahashi et al. ............ 361/807

* cited by examiner

Primary Examiner — Timothy Thompson
Assistant Examiner — Roshn Varghese
(74) Attorney, Agent, or Firm — Kirton McConkie; Evan R. Witt

(57) ABSTRACT

A handheld electronic device and a button input device for use with a handheld electronic device are provided. The handheld electronic device includes a first casing and a second casing. The second casing is slidable with respect to the first casing. The first casing includes a fire button. The second casing includes an auxiliary button and a receiving part for storing the auxiliary button. When the second casing is slid with respect to the first casing, the auxiliary button is rotated with respect to the second casing. As such, the auxiliary button is moved from the receiving part to a surface the first casing for facilitating the user to press.

18 Claims, 8 Drawing Sheets

HANDHELD ELECTRONIC DEVICE AND BUTTON INPUT DEVICE FOR USE WITH HANDHELD ELECTRONIC DEVICE

FIELD OF THE INVENTION

The present invention relates to a handheld electronic device, and more particularly to a handheld electronic device having a sliding cover.

BACKGROUND OF THE INVENTION

Conventionally, the game software is written into a game cartridge or a compact disc and then executed in an exclusive game console. An example of the exclusive game console includes the early-stage Nintendo game console, the widely favorable PlayStation game console (PS1, PS2 or PS3), and the recently marketable Wii console. Nowadays, since people are very busy in many affairs, they usually fail to play the game console after school or after work. As a consequence, handheld game consoles are rapidly gaining in popularity. During the commute time, the waiting time for meal, the waiting time to see a doctor, or any other waiting time, the user may play a handheld game console to kill time. For example, the commercially available handheld game consoles include Sony PSP game consoles, Nintendo NDSL game consoles, and the like.

FIG. 1 is a schematic front view illustrating the appearance of a convention handheld game console. As shown in FIG. 1, the handheld game console 1 comprises a housing 10, plural operating buttons 11, a directional button 12, two fire buttons 13 and a screen 14. When the operating buttons 11 are pressed down, corresponding instructions are inputted and corresponding functions are executed. The directional button 12 indicates the direction of taking an action. The fire buttons provides access to the applications menu for inputting other instructions. The fire buttons 13 includes a right fire button (R) and a left fire button (L). The screen is used for displaying the gaming frame for facilitating the user to view and play the game.

Generally, when the handheld game console is in the non-usage status, it is stored in a backpack of the user. During the transportation period, the handheld game console is readily collided with other objects within the backpack. Since the buttons of the handheld game console is continuously collided in the non-usage status, the use lives of the buttons will be shortened.

For solving the problem of causing continuous collision, the handheld game console is designed to have a sliding cover. Such handheld game console is also referred as a handheld slide-open game console. Generally, the handheld slide-open game console has a first casing and a second casing. The first casing is slidable with respect to the second casing. A display screen is disposed on the first casing. Plural buttons are disposed on the second casing. The plural buttons comprises common buttons, a directional button, fire buttons, and so on. When the handheld slide-open game console is in the non-usage status, the user may move the first casing to cover the plural buttons of the second casing in order to avoid continuous collision of the buttons. Whereas, for using the handheld slide-open game console, the user may move the first casing with respect to the second casing to expose the plural buttons. As such, the buttons are operable by the user.

In comparison with the general handheld game console, the fire button arranged on the second casing of the handheld slide-open game console is a flat button. When the plural buttons of the second casing are sheltered by the first casing, the fire button is not protruded over the first casing, and thus the overall appearance of the handheld slide-open game console is aesthetically pleasing. This handheld slide-open game console, however, still has some drawbacks. For example, when the handheld slide-open game console is in the usage status, the first casing becomes hindrance from operating the flat fire button because the fire button is hindered by the first casing. If the flat fire button is replaced by another fire button that is protruded over the surface of the second casing, the appearance is no longer aesthetically pleasing. Therefore, there is a need of providing a handheld slide-open game console with easy-to-use and aesthetically-pleasing benefits. As know, the slide-open mobile phone fails to possess easy-to-use and aesthetically-pleasing benefits.

SUMMARY OF THE INVENTION

It is an object of the present invention to provide a handheld electronic device with easy-to-use and aesthetically-pleasing benefits.

Another object of the present invention provides a button input device for use with a handheld electronic device with easy-to-use and aesthetically-pleasing benefits.

In accordance with an aspect of the present invention, there is provided a handheld electronic device. The handheld electronic device includes a first casing and a second casing. The first casing has a first upper surface and a first lateral surface perpendicular to the first upper surface. The first casing includes plural operating buttons and a fire button. The operating buttons are disposed on the first upper surface. The fire button is disposed in the first upper surface. The fire button is not protruded over the first casing. The second casing has a second upper surface and a second lower surface parallel with the second upper surface. The second casing is connected with the first casing. The second lower surface is in contact with the first upper surface. The second casing is slidable with respect to the first casing. The second casing includes a screen, an opening, an auxiliary button and a receiving part. The screen is disposed on the second upper surface for displaying an operating frame. The opening is formed in the second lower surface. The auxiliary button includes a rotating shaft and a triggering part. The rotating shaft is inserted within the second casing. The auxiliary button is rotatable with respect to the second casing via the rotating shaft. The receiving part is disposed within the second casing for sheltering the opening and accommodating the auxiliary button. When the first casing is completely covered by the second casing, the auxiliary button is stored within the receiving part. When the second casing is slid with respect to the first casing and the plural operating buttons are exposed outside the first upper surface, the opening is exposed outside the second lower surface, and the auxiliary button is rotated with respect to the second casing and penetrated through the opening, so that the triggering part of the auxiliary button is moved to the first lateral surface and contacted with the fire button.

In an embodiment, the auxiliary button further comprises a metallic element, which is arranged beside the rotating shaft. When the second casing is slid with respect to the first casing, the auxiliary button is rotated with respect to the second casing in response to the weight of the metallic element.

In an embodiment, the first casing further includes a magnetic element for producing a magnetic field. When the auxiliary button is rotated with respect to the second casing and the triggering part is in contact with the fire button, the metallic element enters the magnetic field and the magnetic element produces a magnetic force to attract the metallic element, so that the auxiliary button is fixed on the fire button.

In an embodiment, the fire button further includes a magnetic element for producing a magnetic field. When the auxiliary button is rotated with respect to the second casing and the triggering part is in contact with the fire button, the metallic element enters the magnetic field and the magnetic element produces a magnetic force to attract the metallic element, so that the auxiliary button is fixed on the fire button.

In an embodiment, the auxiliary button further comprises an arc-shaped surface, which is finger-shaped for facilitating a finger to press the auxiliary button.

In an embodiment, when the second casing is slid with respect to the first casing for completely covering the first casing, the first casing is sustained against the auxiliary button, so that the auxiliary button is rotated back to the receiving part.

In an embodiment, the first casing further includes an operating stick, a circuit board and a triggering switch. The operating stick is disposed on the first upper surface and arranged beside the plural operating buttons for inputting a directional instruction. The triggering switch is disposed on the circuit board and arranged beside the fire button. When the triggering switch is triggered by the fire button, the triggering switch generates a pressing signal.

In an embodiment, the handheld electronic device is a mobile phone or a game console.

In accordance with another aspect of the present invention, there is provided a button input device for use with a handheld electronic device. The button input device is connected with the handheld electronic device for inputting a button signal to the handheld electronic device. The button input device includes a first casing and a second casing. The first casing includes plural operating buttons and a fire button. The operating buttons are disposed on the first upper surface. The fire button is disposed in the first upper surface. The fire button is not protruded over the first casing. The second casing has a second upper surface and a second lower surface parallel with the second upper surface. The second casing is connected with the first casing. The second lower surface is in contact with the first upper surface. The second casing is slidable with respect to the first casing. The second casing includes a receptacle, an opening, an auxiliary button and a receiving part. The receptacle is formed in the second upper surface for accommodating the handheld electronic device. The opening is formed in the second lower surface. The auxiliary button includes a rotating shaft and a triggering part. The rotating shaft is inserted within the second casing. The auxiliary button is rotatable with respect to the second casing via the rotating shaft. The receiving part is disposed within the second casing for sheltering the opening and accommodating the auxiliary button. When the first casing is completely covered by the second casing, the auxiliary button is stored within the receiving part. When the second casing is slid with respect to the first casing and the plural operating buttons are exposed outside the first upper surface, the opening is exposed outside the second lower surface, and the auxiliary button is rotated with respect to the second casing and penetrated through the opening, so that the triggering part of the auxiliary button is moved to the first lateral surface and contacted with the fire button.

In an embodiment, the auxiliary button further comprises a metallic element, which is arranged beside the rotating shaft. When the second casing is slid with respect to the first casing, the auxiliary button is rotated with respect to the second casing in response to the weight of the metallic element.

In an embodiment, the first casing further includes a magnetic element for producing a magnetic field. When the auxiliary button is rotated with respect to the second casing and the triggering part is in contact with the fire button, the metallic element enters the magnetic field and the magnetic element produces a magnetic force to attract the metallic element, so that the auxiliary button is fixed on the fire button.

In an embodiment, the fire button further includes a magnetic element for producing a magnetic field. When the auxiliary button is rotated with respect to the second casing and the triggering part is in contact with the fire button, the metallic element enters the magnetic field and the magnetic element produces a magnetic force to attract the metallic element, so that the auxiliary button is fixed on the fire button.

In an embodiment, the auxiliary button further comprises an arc-shaped surface, which is finger-shaped for facilitating a finger to press the auxiliary button.

In an embodiment, when the second casing is slid with respect to the first casing for completely covering the first casing, the first casing is sustained against the auxiliary button, so that the auxiliary button is rotated back to the receiving part.

In an embodiment, the first casing further includes an operating stick, a circuit board and a triggering switch. The operating stick is disposed on the first upper surface and arranged beside the plural operating buttons for inputting a directional instruction. The triggering switch is disposed on the circuit board and arranged beside the fire button. When the triggering switch is triggered by the fire button, the triggering switch generates a pressing signal.

In an embodiment, a connecting part is formed in the receptacle. When the handheld electronic device is stored within the receptacle, the connecting part is electrically connected with the handheld electronic device.

In an embodiment, the handheld electronic device further includes a screen for displaying an operating frame. The screen is exposed outside the second upper surface.

In an embodiment, the handheld electronic device is a mobile phone.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
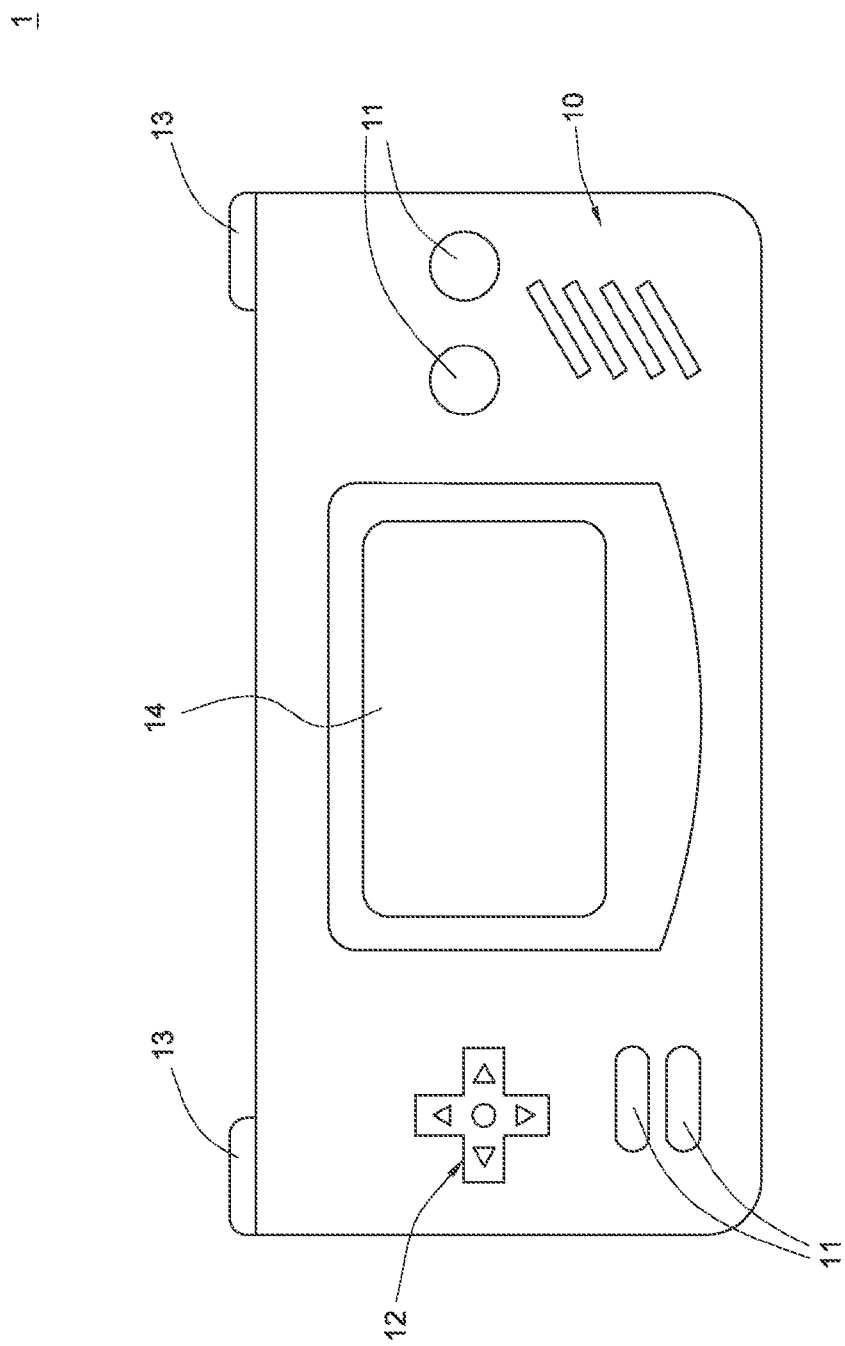
FIG. 1 is a schematic front view illustrating the appearance of a convention handheld game console.
Figure 2:
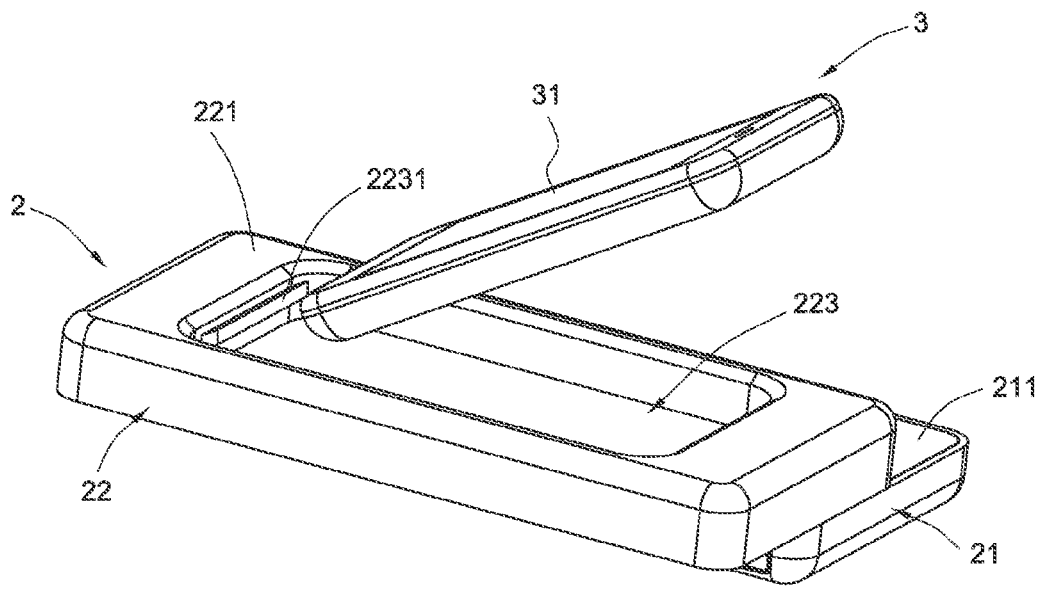
FIG. 2 is a schematic perspective view illustrating the appearance of a button input device for use with a handheld electronic device according to an embodiment of the present invention, in which the handheld electronic device is being stored by the button input device.
Figure 3:
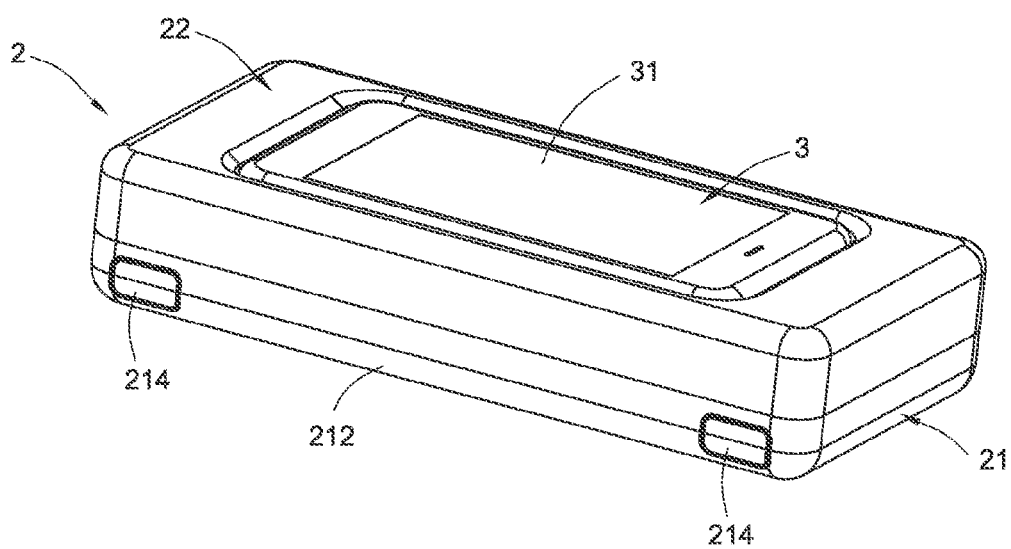
FIG. 3 is a schematic perspective view illustrating the appearance of the button input device for use with a handheld electronic device according to an embodiment of the present invention, in which the button input device is in a close status.

For obviating the drawbacks encountered from the prior art, the present invention a handheld electronic device and a button input device for use with a handheld electronic device. FIG. 2 is a schematic perspective view illustrating the appearance of a button input device for use with a handheld electronic device according to an embodiment of the present invention, in which the handheld electronic device is being stored by the button input device. FIG. 3 is a schematic perspective view illustrating the button input device for use with a handheld electronic device according to an embodiment of the present invention, in which the button input device is in a close status.

Please refer to FIGS. 2 and 3. The button input device 2 comprises a first casing 21 and a second casing 22. The first casing 21 has a first upper surface 211 and a first lateral surface 212. The first lateral surface 212 is perpendicular to the first upper surface 211. The second casing 22 has a second upper surface 221 and a second lower surface 222. The second lower surface 222 is parallel with the second upper surface 221 (see FIG. 4B). The second casing 22 is connected with the first casing 21. The second lower surface 222 is in contact with the first upper surface 211. The second casing 22 is slidable with respect to the first casing 21. As shown in FIG. 3, since the second casing 22 is completely covered by the first casing 21, the button input device 2 is in the close status at this moment.

As shown in FIG. 2, the second casing 22 also comprises a receptacle 223 in the second upper surface 221 for accommodating a handheld electronic device 3. A connecting part 2231 is formed in the receptacle 223. When the handheld electronic device 3 is stored within the receptacle 223, the connecting part 2231 is electrically connected with the handheld electronic device 3. The handheld electronic device 3 comprises a screen 31 for displaying an operating frame. In addition, the screen 31 is exposed outside the second upper surface 221 of the second casing 22. In this embodiment, the handheld electronic device 3 is a mobile phone, and the screen 31 is a touch screen.

Figure 4A:
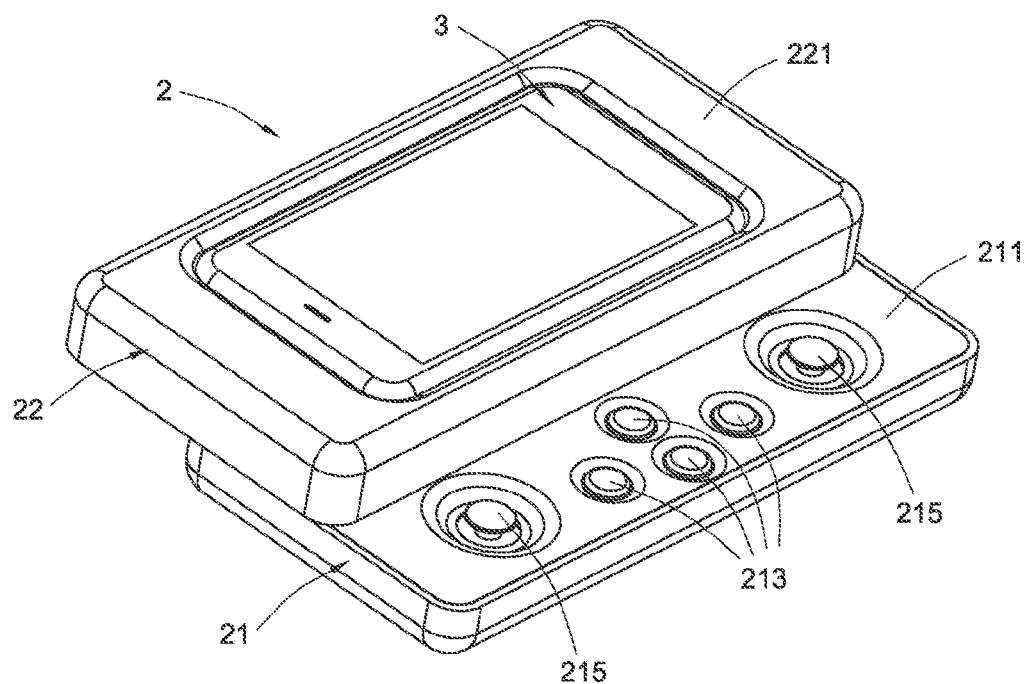
FIGS. 4A and 4B are schematic perspective views illustrating the appearance of the button input device for use with a handheld electronic device according to an embodiment of the present invention, in which the button input device is in an open status.
Figure 4B:
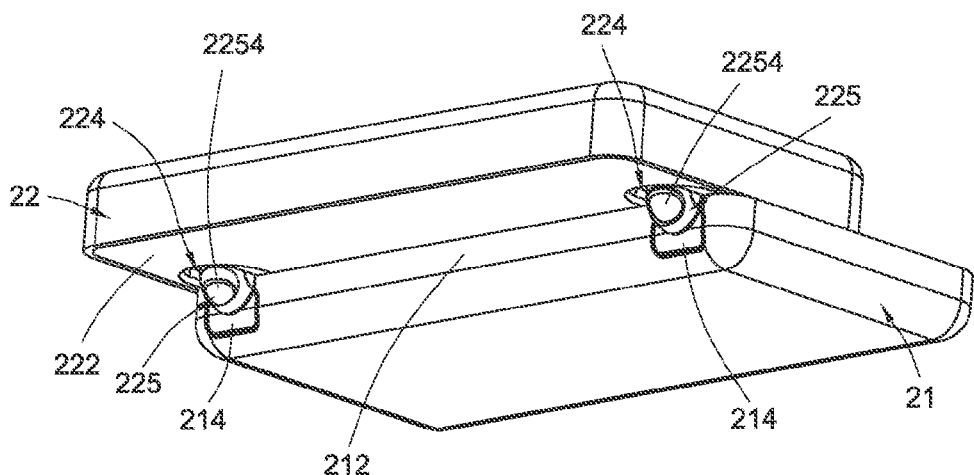

FIGS. 4A and 4B are schematic perspective views illustrating the appearance of the button input device for use with a handheld electronic device according to an embodiment of the present invention, in which the button input device is in an open status. Please refer to FIGS. 2, 4A and 4B. The first casing 21 comprises plural operating buttons 213, at least one fire button 214 and at least one operating stick 215. The plural operating buttons 213 and the operating stick 215 are arranged on the first upper surface 211. When the plural operating buttons 213 are pressed down, corresponding instructions (e.g. a confirming instruction and a selective item instruction) are inputted and corresponding functions are executed. By operating the operating stick 215, a corresponding directional instruction is inputted. The fire button 214 is arranged in the first lateral surface 212. In addition, the fire button 214 is not protruded over the first lateral surface 212. As can be seen from FIG. 3, the fire button 214 of the button input device 2 is substantially a flat button. In a case that the button input device 2 is in the close status, the first casing 21 and the second casing 22 are aesthetically pleasing in their integral appearance.

Figure 5:
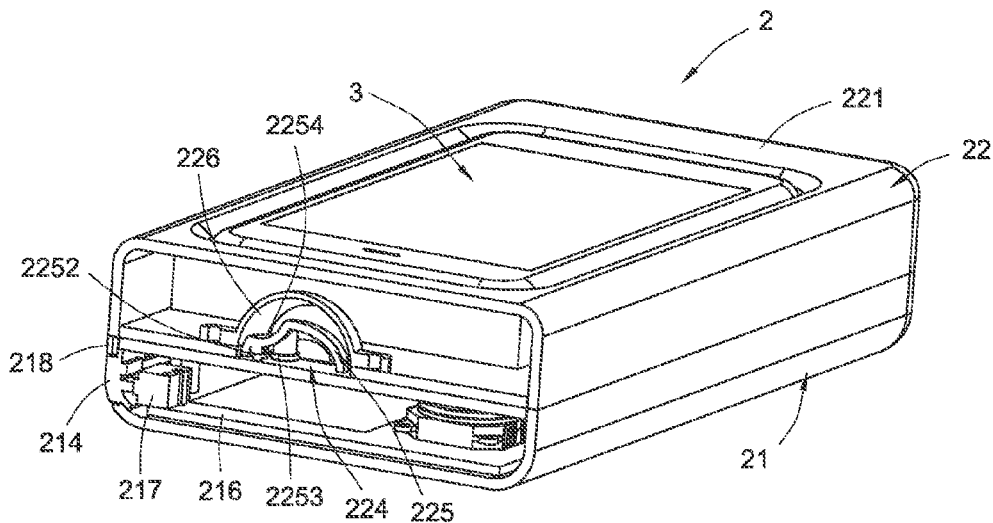
FIG. 5 is a schematic cutaway view illustrating the button input device for use with a handheld electronic device according to an embodiment of the present invention, in which the button input device is in the close status.
Figure 6A:
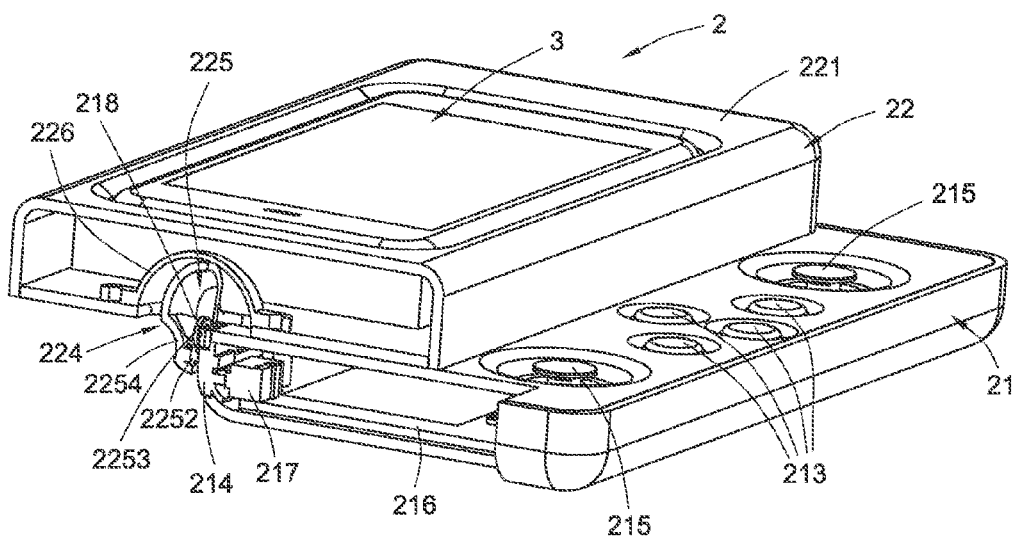
FIG. 6A is a schematic cutaway view illustrating the button input device for use with a handheld electronic device according to an embodiment of the present invention, in which the button input device is in the open status.

Hereinafter, the internal structure of the button input device 2 will be illustrated with reference to FIGS. 5 and 6. FIG. 5 is a schematic cutaway view illustrating the button input device for use with a handheld electronic device according to an embodiment of the present invention, in which the button input device is in the close status. FIG. 6A is a schematic cutaway view illustrating the button input device for use with a handheld electronic device according to an embodiment of the present invention, in which the button input device is in the open status. A circuit board 216, a triggering switch 217 and a magnetic element 218 are disposed within the first casing 21. The triggering switch 217 is disposed on the circuit board 216, and arranged beside the fire button 214. When the fire button 214 is pressed down, the triggering switch 217 is triggered to generate a pressing signal. The magnetic element 218 is used for producing a magnetic field. An example of the magnetic element 218 is a magnet. In addition, the second casing 22 comprises an opening 224, an auxiliary button 225 and a receiving part 226. The opening 224 is formed in the second lower surface 222. In a case that the button input device 2 is in the open status, the opening 224 is exposed outside the second lower surface 222. The receiving part 226 is disposed within the second casing 22 for sheltering the opening 224 and accommodating the auxiliary button 225.

Figure 6B:
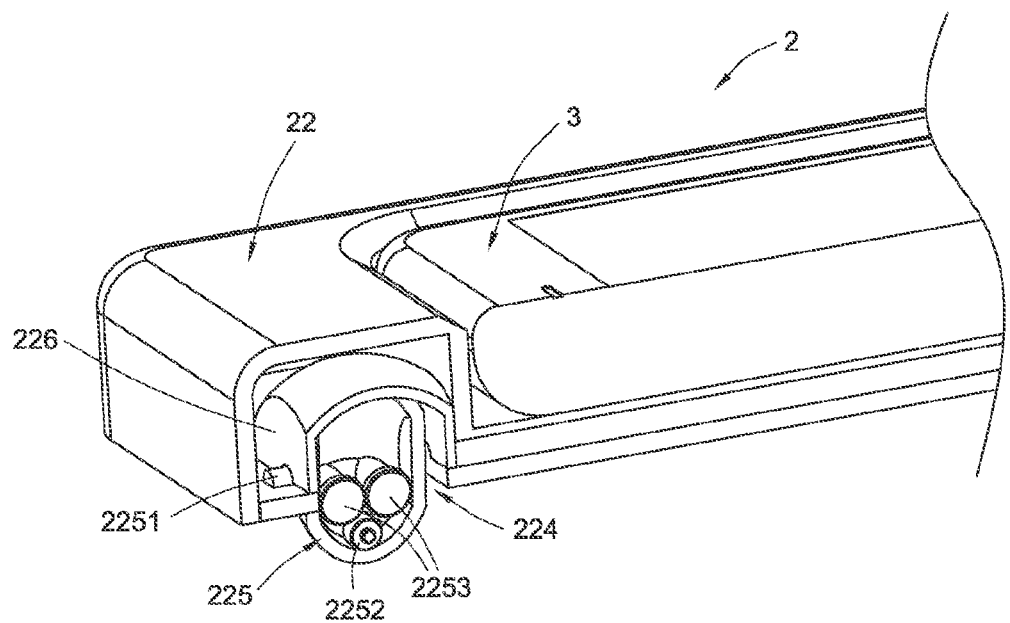
FIG. 6B is a schematic cutaway view illustrating the button input device of FIG. 6A and taken from another viewpoint.

Hereinafter, the structure of the auxiliary button 225 will be illustrated with reference to FIGS. 6A and 6B. FIG. 6B is a schematic cutaway view illustrating the button input device of FIG. 6A and taken from another viewpoint. The auxiliary button 225 comprises a rotating shaft 2251, a triggering part 2252, a metallic element 2253 and an arc-shaped surface 2254. The rotating shaft 2251 is inserted within the second casing 22. Via the rotating shaft 2251, the auxiliary button 225 is rotatable with respect to the second casing 22. The metallic element 2253 is arranged beside the rotating shaft 2251. When the second casing 22 is slid with respect to the first casing 21, the weight of the metallic element 2253 causes the auxiliary button 225 to rotate with respect to the second casing 22. The arc-shaped surface 2254 is finger-shaped for facilitating a user's finger to press the auxiliary button 225. An example of the metallic element 2253 is an iron sheet.

Figure 7A:
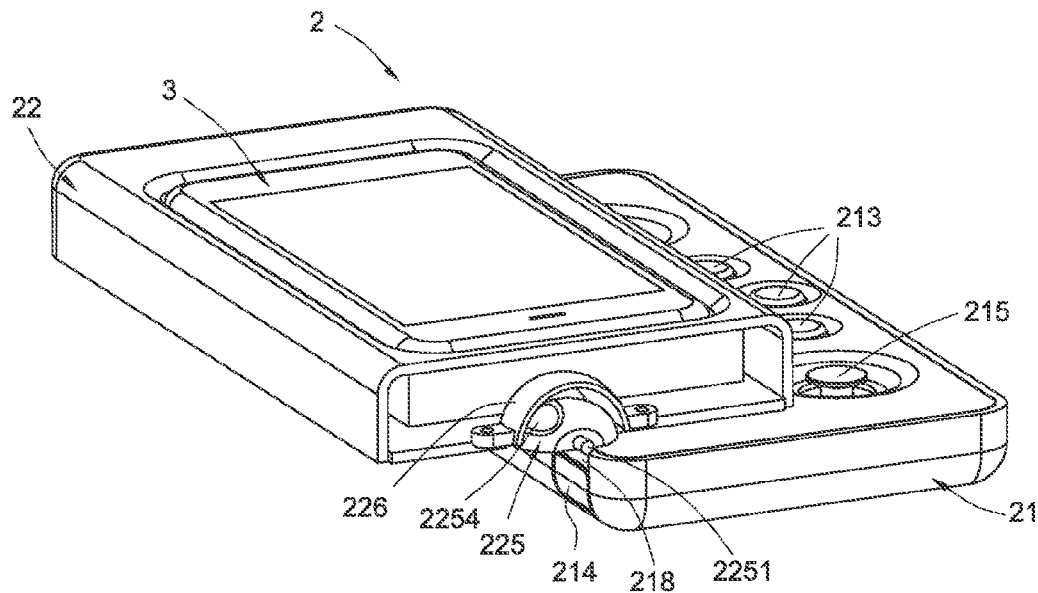
FIGS. 7A, 7B and 7C are schematic side views illustrating the button input device for use with a handheld electronic device according to an embodiment of the present invention, in which the button input device is switched from the close status to the open status.
Figure 7B:
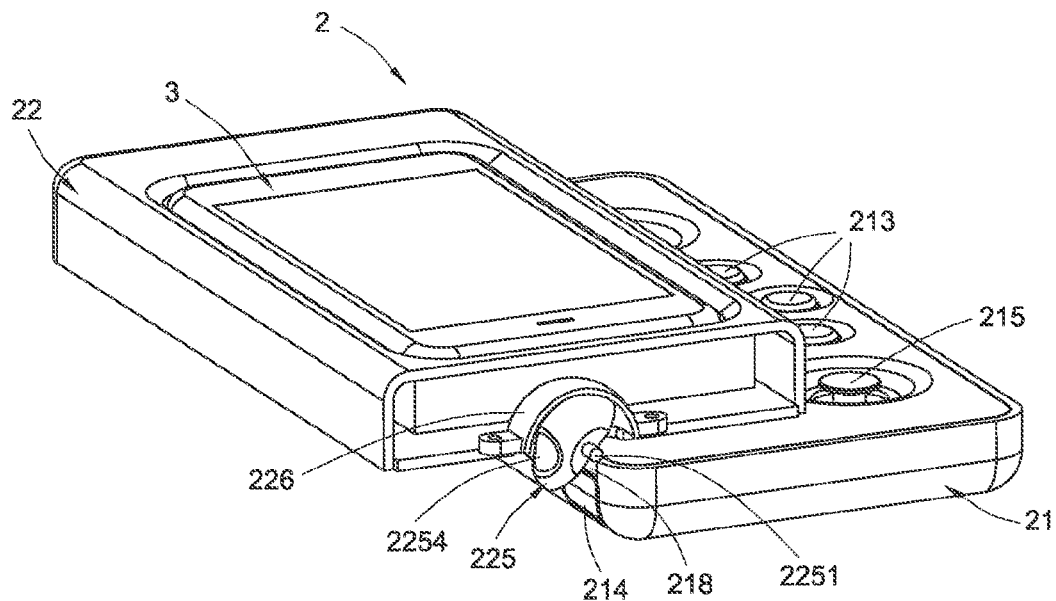
Figure 7C:
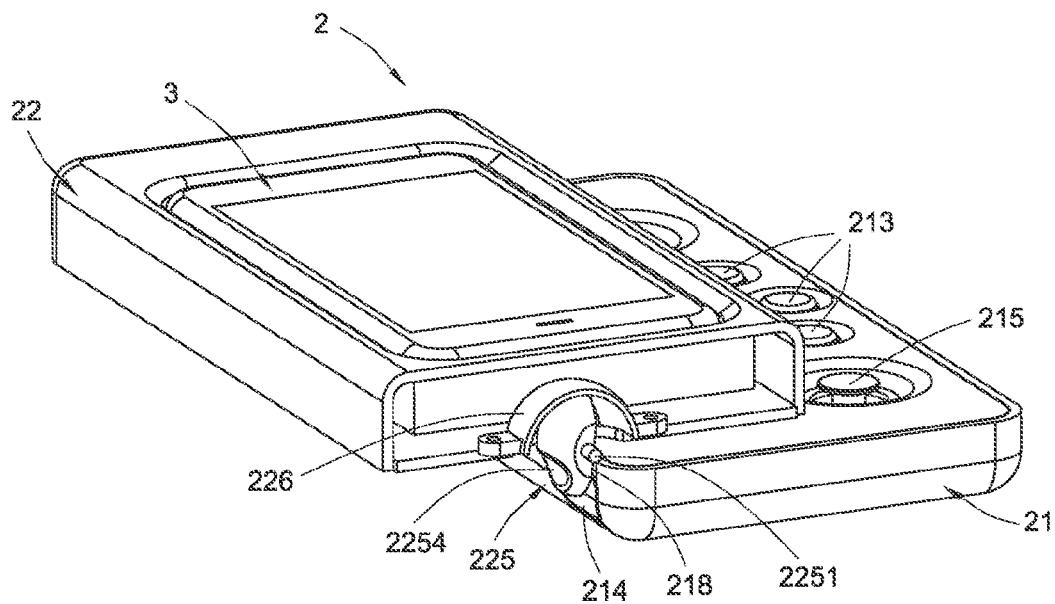

FIGS. 7A, 7B and 7C are schematic side views illustrating the button input device for use with a handheld electronic device according to an embodiment of the present invention, in which the button input device is switched from the close status to the open status. For using the handheld electronic device 3 via the button input device 2, the user may move the second casing 22 to have the second casing 22 slide with respect to the first casing 21, so that the second casing 22 is partially separated from the first casing 21. Meanwhile, plural operating buttons 213 and the operating stick 215 that are arranged on the first upper surface 211 will be exposed outside the first casing 21, and the opening 224 of the second casing 22 is exposed outside the second lower surface 222 (see FIG. 7A). After the second casing 22 is exposed outside the second lower surface 222, the weight of the metallic element 2253 causes the auxiliary button 225 to rotate with respect to the second casing 22, and thus the auxiliary button 225 is penetrated through the opening 224 and exposed out of the second casing 22 (see FIG. 7B). When the auxiliary button 225 is rotated with respect to the second casing 22 to have the triggering part 2252 of the auxiliary button 225 move to the first lateral surface 212 and contact with the fire button 214. As such, the arc-shaped surface 2254 is exposed outside the second casing 22 to be pressed by a user's finger. In addition, as the metallic element 2253 is moved to the first lateral surface 212, the metallic element 2253 enters the magnetic field of the magnetic element 218, and the magnetic element 218 produces a magnetic force to attract the metallic element 2253, so that the auxiliary button 225 is fixed on the fire button 214 (see FIG. 7C).

After the handheld electronic device 3 is used and the user intends to store the handheld electronic device 3, the user may simply move the second casing 22 of the button input device 2 to have the second casing 22 slide with respect to the first casing 21. As such, the first casing 21 is sustained against the auxiliary button 225 to have the auxiliary button 225 rotate back to the opening 224. Until the first casing 21 is completely covered by the second casing 22, the auxiliary button 225 is stored within the receiving part 226.

From the above description, when the button input device 2 is in the close status, the overall appearance of the button input device 2 is aesthetically pleasing because of the above configurations and connecting relationships. In addition, when the button input device 2 is in the open status, the fire button 214 is covered by the auxiliary button 225. As such, the auxiliary button 225 and the fire button 214 are combined together and protruded from the first lateral surface 212 for facilitating the user to press the auxiliary button 225 and the fire button 214.

Figure 8A:
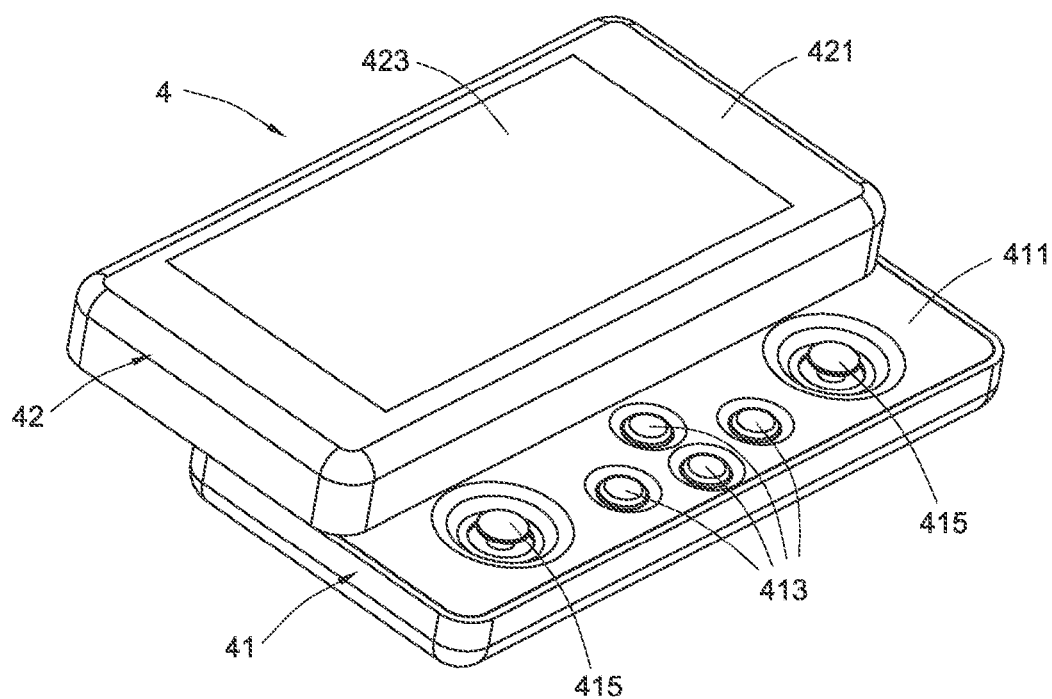
FIGS. 8A and 8B are schematic perspective views illustrating a handheld electronic device in an open status according to another embodiment of the present invention.
Figure 8B:
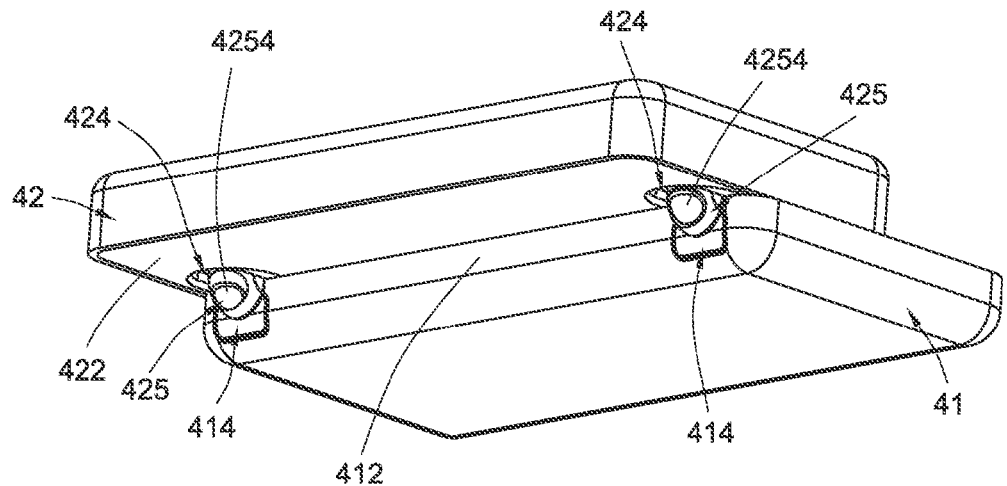

The present invention also provides a handheld electronic device. FIGS. 8A and 8B are schematic perspective views illustrating a handheld electronic device in an open status according to another embodiment of the present invention. The handheld electronic device 4 comprises a first casing 41 and a second casing 42. The first casing 41 has a first upper surface 411 and a first lateral surface 412. The first lateral surface 412 is perpendicular to the first upper surface 411. The second casing 42 has a second upper surface 421 and a second lower surface 422. The second lower surface 422 is parallel with the second upper surface 421. The second casing 42 is connected with the first casing 41. The second lower surface 422 is in contact with the first upper surface 411. The second casing 42 is slidable with respect to the first casing 41. The mechanism of sliding the second casing 42 with respect to the first casing 41 is similar to that illustrated in the above embodiment, and is not redundantly described herein. The first casing 41 comprises plural operating buttons 413, at least one fire button 414 and at least one operating stick 415. The fire button 414 is arranged in the first lateral surface 412. In addition, the fire button 414 is not protruded over the first lateral surface 412. The fire button 414 comprises a magnetic element 4141 for producing a magnetic field. An example of the magnetic element 4141 is a magnet. In this embodiment, a screen 423 is disposed in the second upper surface 421 of the second casing 42 for displaying an operating frame.

Figure 9A:
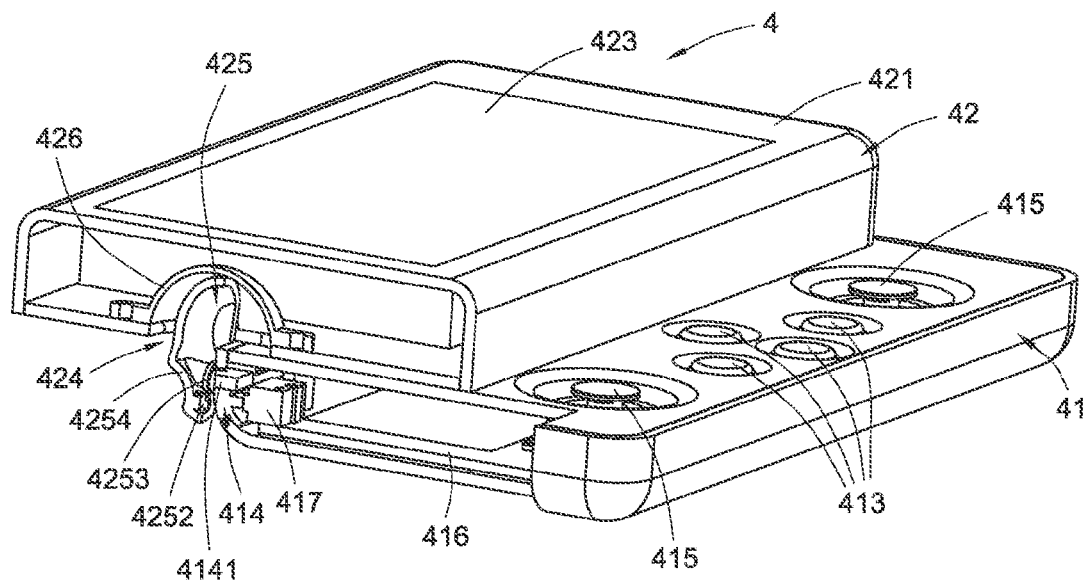
FIGS. 9A and 9B are schematic cutaway views illustrating the handheld electronic device in the open status according to another embodiment of the present invention.
Figure 9B:
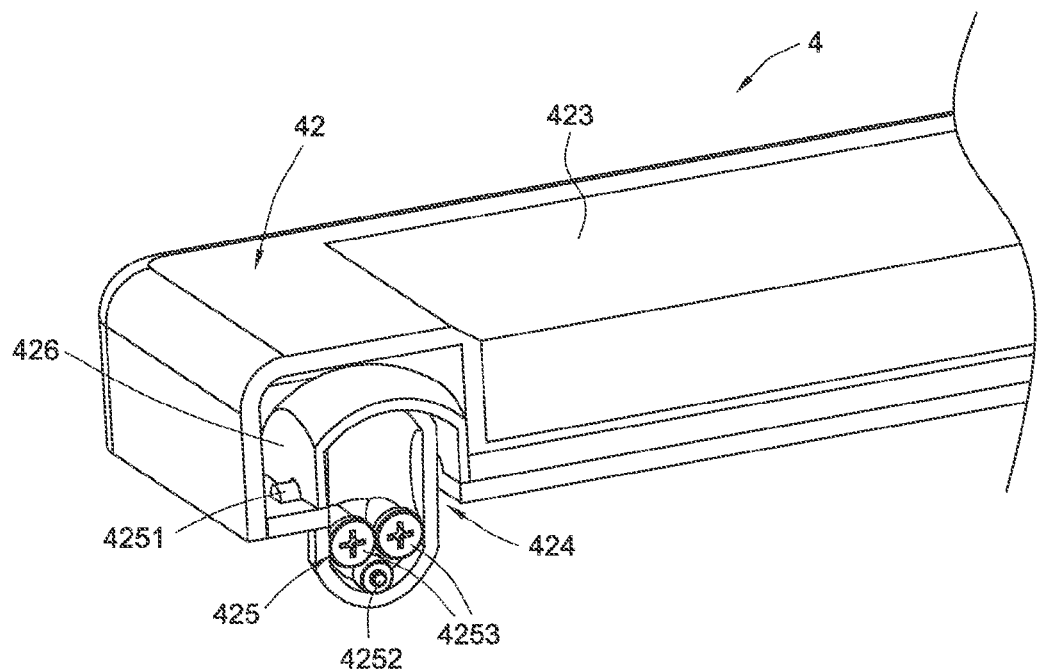

Hereinafter, the internal structure of the handheld electronic device 4 will be illustrated with reference to FIGS. 9A and 9B. FIGS. 9A and 9B are schematic cutaway views illustrating the handheld electronic device in the open status according to another embodiment of the present invention.

A circuit board 416 and a triggering switch 417 are disposed within the first casing 41. The triggering switch 417 is disposed on the circuit board 416, and arranged beside the fire button 414. When the fire button 414 is pressed down, the triggering switch 417 is triggered to generate a pressing signal. In addition, the second casing 42 comprises an opening 424, an auxiliary button 425 and a receiving part 426. The opening 424 is formed in the second lower surface 422. In a case that the button input device 4 is in the open status, the opening 424 is exposed outside the second lower surface 422. The receiving part 426 is disposed within the second casing 42 for sheltering the opening 424 and accommodating the auxiliary button 425.

As shown in FIG. 9B, the auxiliary button 425 comprises a rotating shaft 4251, a triggering part 4252, a metallic element 4253 and an arc-shaped surface 4254. The rotating shaft 4251 is inserted within the second casing 42. Via the rotating shaft 4251, the auxiliary button 425 is rotatable with respect to the second casing 42. The metallic element 4253 is arranged beside the rotating shaft 4251. When the second casing 42 is slid with respect to the first casing 41, the weight of the metallic element 4253 causes the auxiliary button 425 to rotate with respect to the second casing 42. The arc-shaped surface 4254 is finger-shaped for facilitating a user's finger to press the auxiliary button 425. An example of the metallic element 4253 is an iron screw.

In this embodiment, the screen 423 is disposed in the second casing 42 of the handheld electronic device 4, and the fire button 414 of the handheld electronic device 4 further includes the magnetic element 4141. In addition, the auxiliary button 425 of the handheld electronic device 4 is slightly larger than the auxiliary button 225 of the button input device 2, so that the majority of the fire button 414 is covered by the auxiliary button 425. In this situation, as the auxiliary button 425 is rotated with respect to the second casing 42, the metallic element 4253 enters the magnetic field of the magnetic element 4141, and the magnetic element 4141 produces a magnetic force to attract the metallic element 4253 of the first casing 41, so that the auxiliary button 425 is fixed on the fire button 414. In addition, the handheld electronic device 4 is a mobile phone or a game console. In this embodiment, the handheld electronic device 4 is a game console. The configurations and operating principles of the other components of the handheld electronic device 4 are similar to those shown in the button input device 2 of the above embodiment, and are not redundantly described herein, so that the auxiliary button 225 is fixed on the fire button 214

From the above description, when the handheld electronic device or the button input device is in the close status, the overall appearance of the casings is aesthetically pleasing because of the above configurations and connecting relationships. In addition, when the handheld electronic device or the button input device is in the open status, the fire button is covered by the auxiliary button. As such, the auxiliary button and the fire button are combined together and protruded from the first lateral surface for facilitating the user to press the auxiliary button and the fire button. In other words, the handheld electronic device or the button input device for use with a handheld electronic device according to the present invention is both easy-to-use and aesthetically-pleasing.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A handheld electronic device, comprising:
   a first casing having a first upper surface and a first lateral surface perpendicular to said first upper surface, and comprising:
      plural operating buttons disposed on said first upper surface; and
      a fire button disposed in said first upper surface, wherein said fire button is not protruded over the first casing; and
   a second casing having a second upper surface and a second lower surface parallel with said second upper surface, wherein said second casing is connected with said first casing, said second lower surface is in contact with said first upper surface, and said second casing is slidable with respect to said first casing, and said second casing comprises:
      a screen disposed on said second upper surface for displaying an operating frame;
      an opening formed in said second lower surface;
      an auxiliary button comprising a rotating shaft and a triggering part, wherein said rotating shaft is inserted within said second casing, and said auxiliary button is rotatable with respect to said second casing via said rotating shaft; and
      a receiving part disposed within said second casing for sheltering said opening and accommodating said auxiliary button, wherein when said first casing is completely covered by said second casing, said auxiliary button is stored within said receiving part, wherein when said second casing is slid with respect to said first casing and said plural operating buttons are exposed outside said first upper surface, said opening is exposed outside said second lower surface, and said auxiliary button is rotated with respect to said second casing and penetrated through said opening, so that said triggering part of said auxiliary button is moved to said first lateral surface and contacted with said fire button.

2. The handheld electronic device according to claim 1 wherein said auxiliary button further comprises a metallic element, which is arranged beside said rotating shaft, wherein when said second casing is slid with respect to said first casing, said auxiliary button is rotated with respect to said second casing in response to the weight of said metallic element.

3. The handheld electronic device according to claim 2 wherein said first casing further comprises a magnetic element for producing a magnetic field, wherein when said auxiliary button is rotated with respect to said second casing and said triggering part is in contact with said fire button, said metallic element enters said magnetic field and said magnetic element produces a magnetic force to attract said metallic element, so that said auxiliary button is fixed on said fire button.

4. The handheld electronic device according to claim 2 wherein said fire button further comprises a magnetic element for producing a magnetic field, wherein when said auxiliary button is rotated with respect to said second casing and said triggering part is in contact with said fire button, said metallic element enters said magnetic field and said magnetic element produces a magnetic force to attract said metallic element, so that said auxiliary button is fixed on said fire button.

5. The handheld electronic device according to claim 1 wherein said auxiliary button further comprises an arc-shaped surface, which is finger-shaped for facilitating a finger to press said auxiliary button.

6. The handheld electronic device according to claim 1 wherein when said second casing is slid with respect to said first casing for completely covering said first casing, said first casing is sustained against said auxiliary button, so that said auxiliary button is rotated back to said receiving part.

7. The handheld electronic device according to claim 1 wherein said first casing further comprises:
   an operating stick disposed on said first upper surface and arranged beside said plural operating buttons for inputting a directional instruction;
   a circuit board; and
   a triggering switch disposed on said circuit board and arranged beside said fire button, wherein when said triggering switch is triggered by said fire button, said triggering switch generates a pressing signal.

8. The handheld electronic device according to claim 1 wherein said handheld electronic device is a mobile phone or a game console.

9. A button input device for use with a handheld electronic device, said button input device being connected with said handheld electronic device for inputting a button signal to said handheld electronic device, said button input device comprising:
   a first casing having a first upper surface and a first lateral surface perpendicular to said first upper surface, and comprising:
      plural operating buttons disposed on said first upper surface; and
      a fire button disposed in said first upper surface, wherein said fire button is not protruded over the first casing; and
   a second casing having a second upper surface and a second lower surface parallel with said second upper surface, wherein said second casing is connected with said first casing, said second lower surface is in contact with said first upper surface, and said second casing is slidable with respect to said first casing, and said second casing comprises:
      a receptacle formed in said second upper surface for accommodating said handheld electronic device;
      an opening formed in said second lower surface;
      an auxiliary button comprising a rotating shaft and a triggering part, wherein said rotating shaft is inserted within said second casing, and said auxiliary button is rotatable with respect to said second casing via said rotating shaft; and
      a receiving part disposed within said second casing for sheltering said opening and accommodating said auxiliary button, wherein when said first casing is completely covered by said second casing, said auxiliary button is stored within said receiving part, wherein when said second casing is slid with respect to said first casing and said plural operating buttons are exposed outside said first upper surface, said opening is exposed outside said second lower surface, and said auxiliary button is rotated with respect to said second casing and penetrated through said opening, so that said triggering part of said auxiliary button is moved to said first lateral surface and contacted with said fire button.

10. The button input device according to claim 9 wherein said auxiliary button further comprises a metallic element, which is arranged beside said rotating shaft, wherein when said second casing is slid with respect to said first casing, said auxiliary button is rotated with respect to said second casing in response to the weight of said metallic element.

11. The button input device according to claim 10 wherein said first casing further comprises a magnetic element for producing a magnetic field, wherein when said auxiliary button is rotated with respect to said second casing and said triggering part is in contact with said fire button, said metallic element enters said magnetic field and said magnetic element produces a magnetic force to attract said metallic element, so that said auxiliary button is fixed on said fire button.

12. The button input device according to claim 10 wherein said fire button further comprises a magnetic element for producing a magnetic field, wherein when said auxiliary button is rotated with respect to said second casing and said triggering part is in contact with said fire button, said metallic element enters said magnetic field and said magnetic element produces a magnetic force to attract said metallic element, so that said auxiliary button is fixed on said fire button.

13. The button input device according to claim 10 wherein said auxiliary button further comprises an arc-shaped surface, which is finger-shaped for facilitating a finger to press said auxiliary button.

14. The button input device according to claim 9 wherein when said second casing is slid with respect to said first casing for completely covering said first casing, said first casing is sustained against said auxiliary button, so that said auxiliary button is rotated back to said receiving part.

15. The button input device according to claim 9 wherein said first casing further comprises:
  an operating stick disposed on said first upper surface and arranged beside said plural operating buttons for inputting a directional instruction;
  a circuit board; and
  a triggering switch disposed on said circuit board and arranged beside said fire button, wherein when said triggering switch is triggered by said fire button, said triggering switch generates a pressing signal.

16. The button input device according to claim 9 wherein a connecting part is formed in said receptacle, wherein when said handheld electronic device is stored within said receptacle, said connecting part is electrically connected with said handheld electronic device.

17. The button input device according to claim 9 wherein said handheld electronic device further comprises a screen for displaying an operating frame, and said screen is exposed outside said second upper surface.

18. The button input device according to claim 9 wherein said handheld electronic device is a mobile phone.

* * * * *